United States Patent [19]
Chern et al.

[11] Patent Number: 5,381,364
[45] Date of Patent: Jan. 10, 1995

[54] FERROELECTRIC-BASED RAM SENSING SCHEME INCLUDING BIT-LINE CAPACITANCE ISOLATION

[75] Inventors: Wen-Foo Chern; Brett Meadows, both of Colorado Springs, Colo.

[73] Assignee: Ramtron International Corporation, Colorado Springs, Colo.

[21] Appl. No.: 83,883

[22] Filed: Jun. 24, 1993

[51] Int. Cl.⁶ ............................................. G11C 11/22
[52] U.S. Cl. ................................... 365/145; 365/149
[58] Field of Search ................. 365/145, 149, 65, 117, 365/210, 203, 189.01; 257/295

[56] References Cited

U.S. PATENT DOCUMENTS

| | | | |
|---|---|---|---|
| 4,873,664 | 10/1989 | Eaton, Jr. | 365/145 |
| 4,888,733 | 12/1989 | Mobley | 365/145 |
| 5,010,518 | 4/1991 | Toda | 365/149 |
| 5,068,831 | 11/1991 | Hoshi | 365/203 |
| 5,079,746 | 1/1992 | Sato | 365/149 |

OTHER PUBLICATIONS

Womack et al., "A 16 kb Ferroelectric Nonvolatile Memory With a Bit Parallel Architecture" *1989 IEEE International Solid-State Circuits Conference* (Feb. 1989).

*Primary Examiner*—Eugene R. LaRoche
*Assistant Examiner*—A. Zarabian
*Attorney, Agent, or Firm*—Peter J. Meza

[57] ABSTRACT

A ferroelectric memory includes a bit line for developing a signal coupled to a ferroelectric memory cell. An integrated load capacitor and sense amplifier are also coupled to the bit line. An isolation circuit is included for selectively electrically isolating the bit line load capacitor from the sense amplifier and ferroelectric memory cell during the active operation of the sense amplifier. The isolation circuit is compatible with both non-volatile ferroelectric and volatile dynamic memory operation.

27 Claims, 7 Drawing Sheets

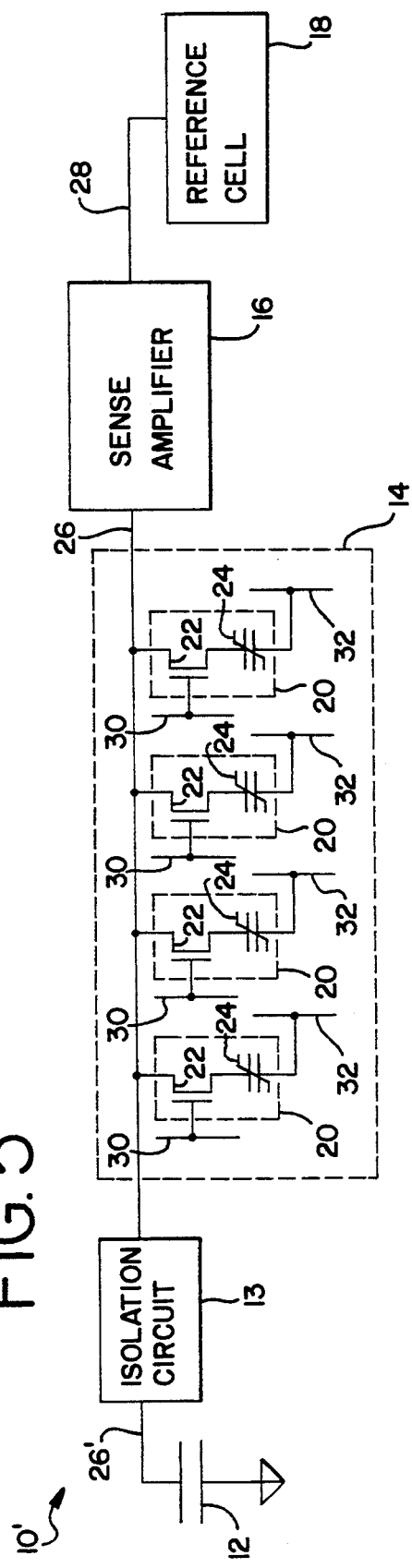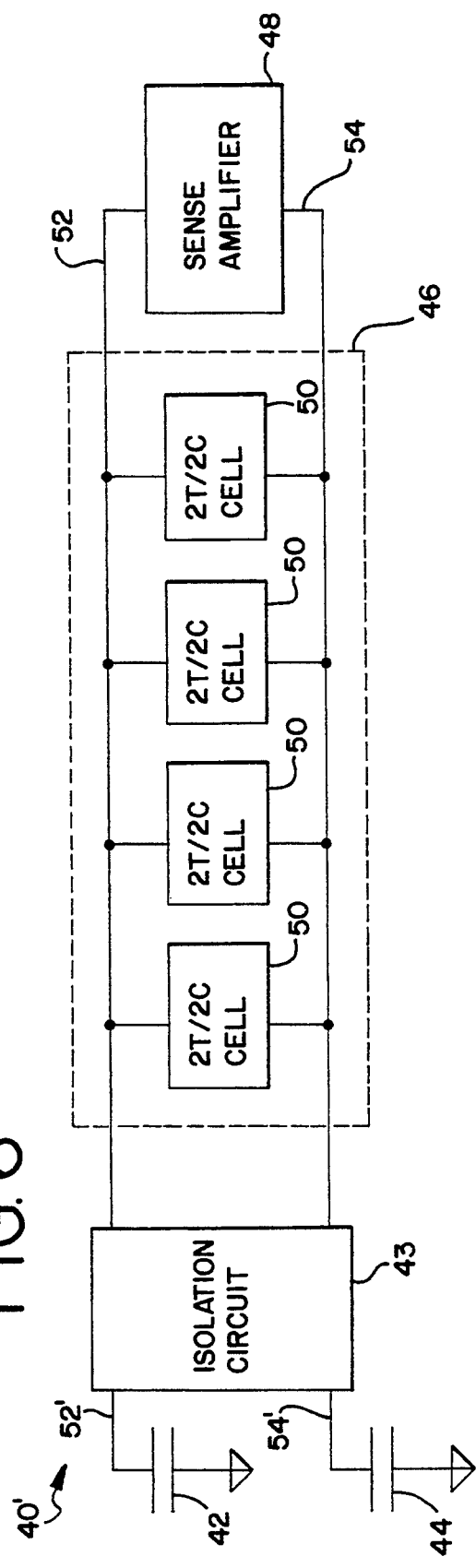

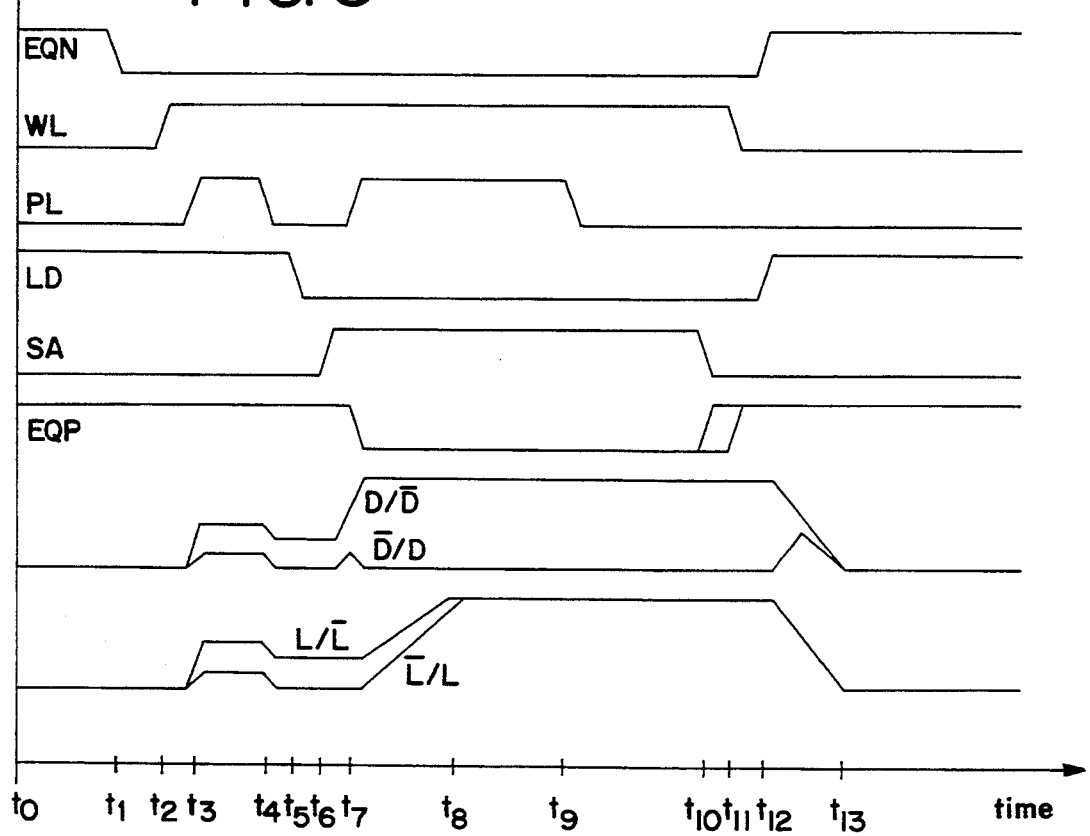
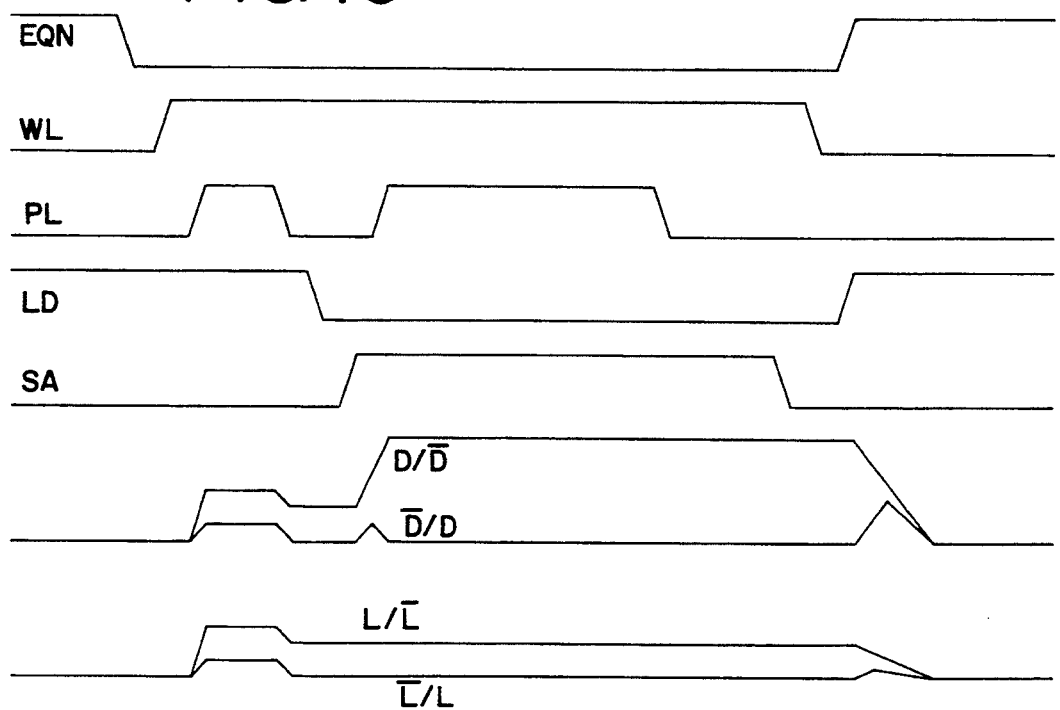

FERROELECTRIC-BASED RAM SENSING SCHEME INCLUDING BIT-LINE CAPACITANCE ISOLATION

BACKGROUND OF THE INVENTION

This invention relates generally to ferroelectric memory circuits and, more particularly, to an improved sensing and writing scheme for use with ferroelectric memory cells.

A column 10 of a one-transistor, one-capacitor ("1T-1C") ferroelectric memory array circuit is shown in the simplified circuit diagram of FIG. 1. (The use of "column" and "row" designations is based upon conventions in the art, and does not necessarily correspond to the orientation shown in the drawing figures.) Although memory circuits typically include numerous columns for simplicity and clarity only one column 10 is shown in FIG. 1. Column 10 includes a sense amplifier 16 coupled to complementary bit lines 26 and 28. Bit line 26 (a first input of sense amplifier 16) is coupled to a column portion 14 of 1T-1C memory cells and has an associated bit line capacitance illustrated as capacitor 12. Bit line 28 (a reference input of sense amplifier 16,) is coupled to a reference cell 18. It will be appreciated by those skilled in the art that an actual column 10 is symmetrical with respect to sense amplifier 16, and that the schematic diagram of FIG. 1 represents a simplified electrical equivalent circuit. In practice, each bit line has an associated bit line, capacitance, attached memory cells, and a reference cell. Four 1T-1C ferroelectric memory cells 20 are shown within column portion 14 in FIG. 1, although any number can be used. Each memory cell 20 is representative of an entire row of memory cells (not shown) that span column 10. Each memory cell 20 includes an MOS access transistor 22 and a ferroelectric capacitor 24. The drain of access transistor 22 forms a data input/output node of each memory cell and is coupled to bit line 26. Each memory cell 20 is read from and written to by the action of a corresponding word line 30, and a corresponding plate line 32.

A column 40 of an alternative two-transistor, two-capacitor ("2T-2C") ferroelectric memory array circuit is shown in the simplified circuit diagram of FIG. 2. Column 40 includes a sense amplifier 48 coupled to complementary bit lines 52 and 54. Complementary bit lines 52 and 54 are coupled to a column portion 46 of 2T-2C memory cells. Each bit line has an associated bit line capacitance illustrated as capacitors 42 and 44. Since data is stored in a differential fashion in memory cells 50, column 40 does not include a reference cell. Four 2T-2C ferroelectric memory cells 50 representative of an entire row of memory cells are shown within column portion 46 in FIG. 2, although any number can be used. Referring now to FIG. 3, each memory cell 50 includes two MOS access transistors 60 and 62 and corresponding ferroelectric capacitors 64 and 66. The drain of access transistors 60 and 62 forms a complementary pair of data input/output nodes that are coupled to complementary bit lines 52 and 54. Each memory cell 50 is read from and written to by the action of a corresponding word line 56, and a corresponding plate line 58.

The operation of reading data from a ferroelectric memory cell, which resides in the non-volatile polarization of the ferroelectric capacitor and not the volatile quiescent stored voltage thereon, is described in U.S. Pat. No. 4,873,664 to Eaton. Jr. entitled "Self Restoring Ferroelectric Memory" and U.S. Pat. No. 4,888,733 to Mobley entitled "Non-volatile Memory Cell and Sensing Method", both of which patents are hereby incorporated by reference. An alternative method of reading data from a ferroelectric memory cell is described in a pending patent application Ser. No. 08/040,762 to Parris and Wilson, also assigned to Ramtron International Corporation and entitled "Ferroelectric Return to Zero Sensing Method", which is also hereby incorporated by reference. In each of these sensing methods, the ferroelectric capacitor is "poled" and charge is liberated that is stored in the capacitance associated with the bit line.

The bit line capacitance mentioned above in conjunction with the 1T-1C or 2T-2C memory circuits can either be the parasitic capacitance inherent in the bit line itself if a large number of memory cells are used in the memory array, or an additional integrated capacitance if the number of memory cells is small. In the latter case, the parasitic capacitance of the bit line is not sufficient to develop a voltage signal that can be sensed by the sense amplifier. In the present state of the art, this is true for ferroelectric memories. In FIG. 4, a graph is shown illustrating the relationship between the voltage signal developed at the bit line and the ratio of the memory cell capacitance to the bit line (digit line) capacitance. In FIG. 1, this is the ratio of capacitor 24 to capacitor 12. In FIG. 2, this is the ratio of capacitor 64 or 66 to capacitor 42 or 44. Note that no signal is developed if there is no bit line capacitance (ratio of infinity), and signal developed if there is no memory cell capacitance (ratio of zero). Between the two endpoints of the ratio axis, there exists some ideal ratio, for example one-to-three, where the bit line signal level is maximized. The ideal ratio will vary with the exact semiconductor process used, type of ferroelectric material used, number of memory cells, and word and plate line voltages used, among other factors, but it is currently believed that a ratio of about one is desirable. To achieve the optimum ratio that results in maximum bit line signal levels, an extrinsic capacitance is therefore needed in ferroelectric memories of relatively low density to supplement the parasitic capacitance of the bit line.

One problem with the additional bit line capacitance is that once fabricated, it is permanently connected to the bit line, which is in turn connected to the sense amplifier. This hardwire connection is shown in both FIG. 1 and FIG. 2. In the sensing operation of a ferroelectric memory, charge is transferred from the poled ferroelectric capacitor to the bit line. Once this is accomplished, the sense amplifier is activated to amplify the charge on the bit line and latch full logic levels. Since the extrinsic bit line capacitance is permanently connected to the sense amplifier and must be charge. when the bit line reaches full logic levels, the additional capacitance contributes to the operating current required, and creates transient current spikes that cause the power supply and ground lines to bounce. The larger the bit line capacitance needed for maximum signal levels, the worse the spiking and increase in operating current become. Alternatively, operating current can be maintained at a desirably low level, but at the expense of operating speed. Neither of these operating conditions is desirable.

What is desired is a method and circuit for eliminating the spiking and increased operating current caused by the necessary bit line capacitance during the active operation of the sense amplifiers a ferroelectric memory.

SUMMARY OF THE INVENTION

It is, therefore, a principal object of the present invention to improve the sensing operation of a ferroelectric memory.

It is another object of the present invention to improve the writing operation of a ferroelectric memory.

It is an advantage of the invention that the correct cell capacitance to bit line capacitance ratio is maintained for developing the bit line signal, but that current spiking and power and ground line bounce are significantly reduced during the active operation of the sense amplifiers.

It is another advantage of the invention that the present circuit is compatible with both non-volatile ferroelectric memory operation, where the ferroelectric capacitors are polarized and poled, and volatile dynamic memory operation, where the ferroelectric capacitor are charged and discharged in a standard, non-poled fashion.

According to the present invention a ferroelectric memory includes a bit line for developing a signal coupled to a ferroelectric memory cell. An integrated load capacitor and sense amplifier are also coupled to the bit line. An isolation circuit is included for selectively electrically isolating the bit line load capacitor from the sense amplifier and ferroelectric memory cell during the active operation of the sense amplifier.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 5 is a simplified circuit diagram of a column of a 1T-1C ferroelectric memory array modified according to the present invention;

FIG. 6 is a simplified circuit diagram of a column of a 2T-2C ferroelectric memory array modified according to the present invention;

FIG. 8 is a timing diagram associated with FIG. 7;

FIG. 10 is a timing diagram associated with FIG. 9; and

DETAILED DESCRIPTION

Figure 1:
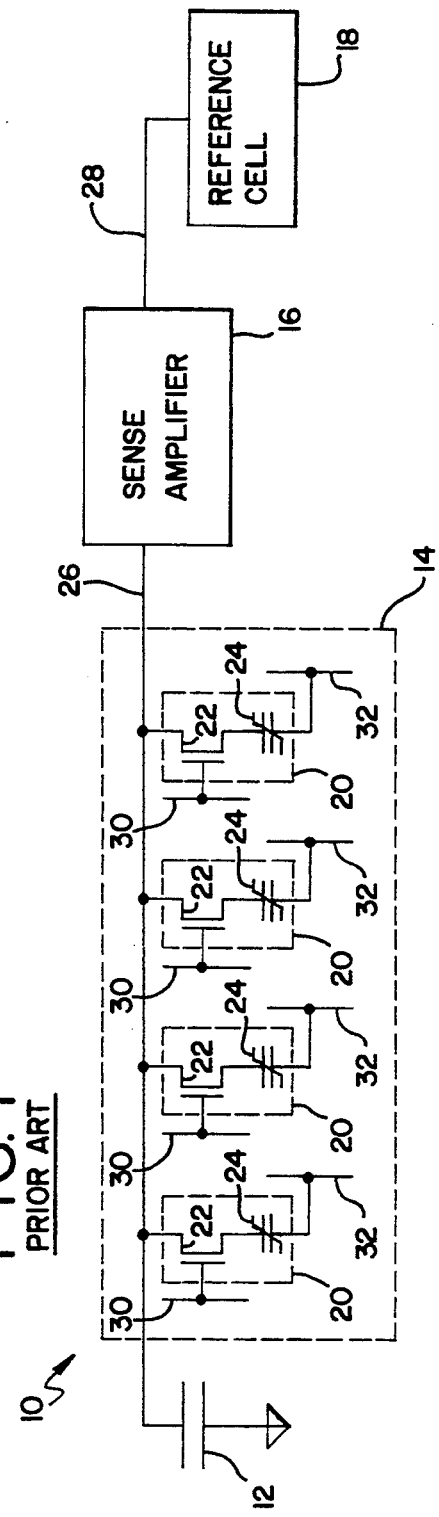
FIG. 1 is a simplified circuit diagram of a column of a 1T-1C ferroelectric memory array.
Figure 2:
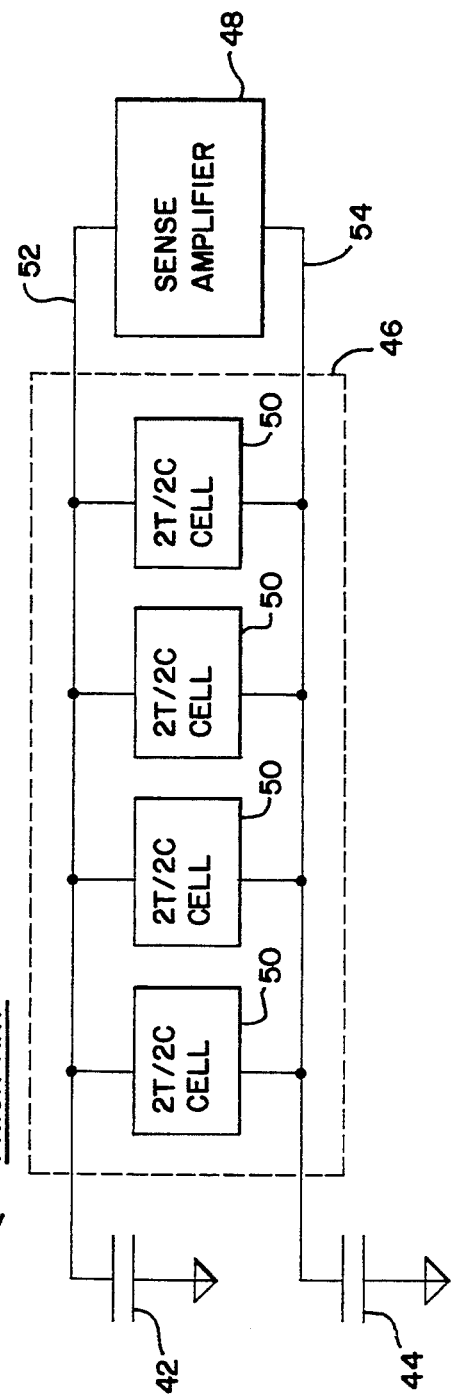
FIG. 2 is a simplified circuit diagram of a column of a 2T-2C ferroelectric memory array.
Figure 4:
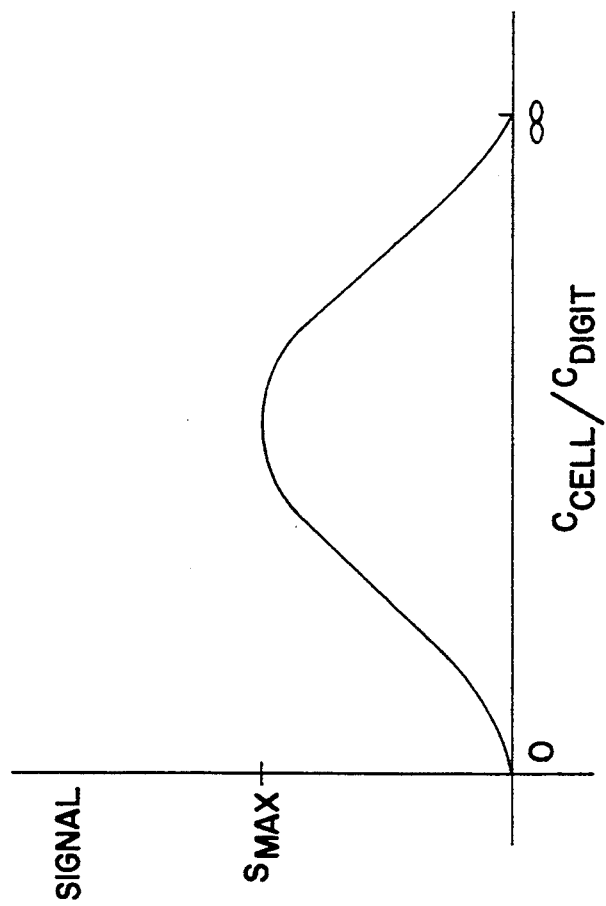
FIG. 4 is a graph illustrating bit line signal strength versus capacitor ratio.
Figure 3:
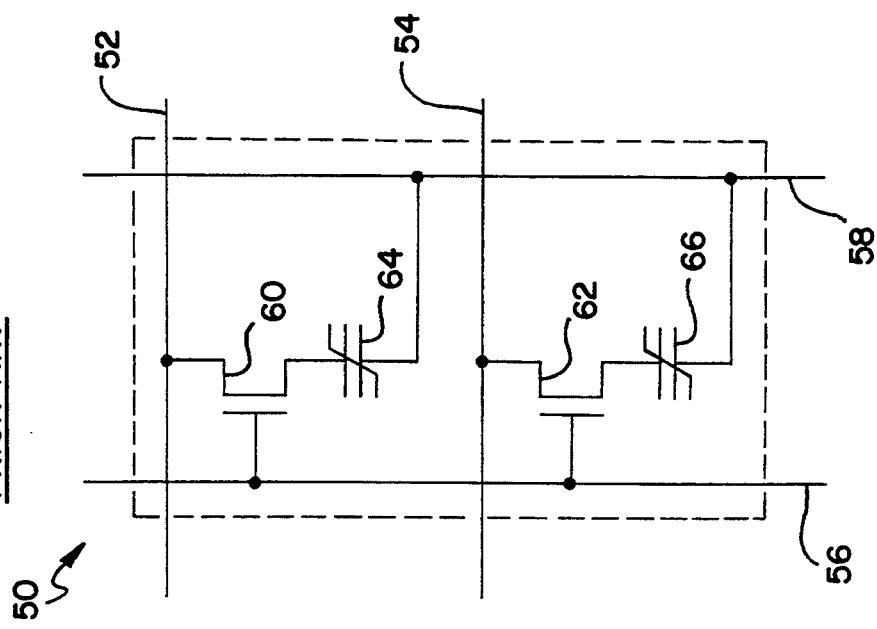
FIG. 3 is a circuit diagram of a 2T-2C memory cell.

Referring now to FIG. 5, a column 10' of a 1T-1C ferroelectric memory array circuit modified according to the present invention is shown including isolation circuit 13. Sense amplifier 16 remains coupled to complementary bit lines 26 and 28. However, a first portion of bit line 26 is now coupled to column portion 14 of 1T-1C memory cells and a second portion of bit line 26' is coupled to bit line capacitor 12. The first and second portions of bit line 26 are separated by isolation circuit 13. Bit line 28 remains coupled to reference cell 18. The actual column 10' is still symmetrical with respect to sense amplifier 16. In practice, each bit line has an associated bit line capacitance, attached memory cells, a reference cell, and an isolation circuit. Four 1T-1C ferroelectric memory cells 20, each representative of an entire row of memory cells, are shown within column portion 14 in FIG. 5, although any number can be used.

In FIG. 6, a column 40' of a 2T-2C ferroelectric memory array circuit modified according to the present invention is shown including isolation circuit 43. Sense amplifier 48 remains coupled to complementary bit line pair consisting of bit lines 52 and 54. However, a first portion of the bit line pair 52, 54 is now coupled to the column portion 14 of 1T-1C memory cells and a second portion of the bit line pair 52', 54' is coupled to bit line capacitors 42 and 44. The first and second portions of bit line 26 are separated by isolation circuit 43. Four 2T-2C ferroelectric memory cells 50 are shown within a column portion 46 in FIG. 6, although any number can be used. The operation of column 40' is described below with reference to circuit level embodiments 70 and 90.

Figure 7:
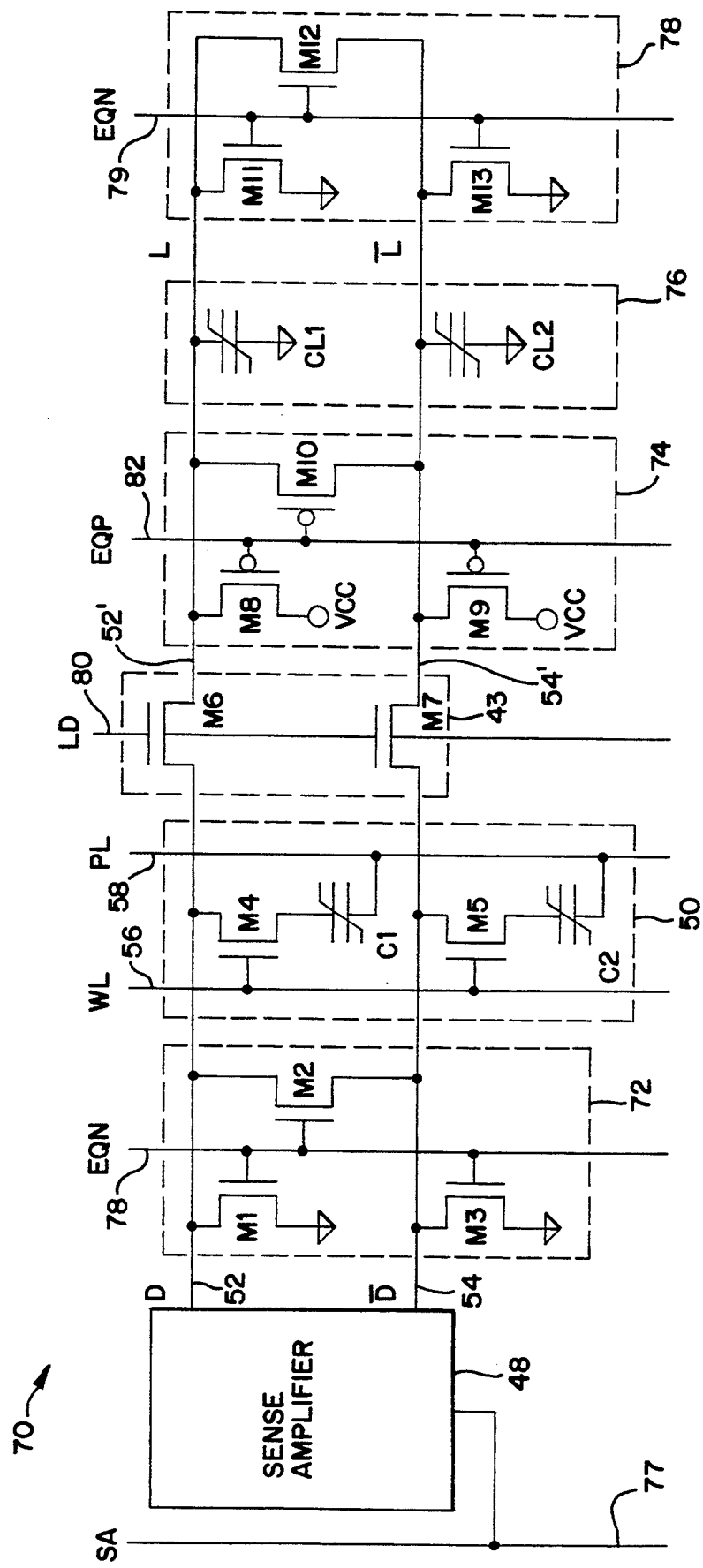
FIG. 7 is a circuit diagram of a first embodiment of the present invention.

Referring now to FIG. 7, a circuit 70, which is a first circuit level embodiment of the present invention, is shown including a cross-coupled sense amplifier 48 coupled to a first portion of a differential bit line pair 52, 54 labeled D and /D. The sense amplifier has a sense amplifier enable input 77 labeled SA. Coupled across the first portion of the differential bit line pair 52, 54 is a VSS equilibration circuit 72 consisting of N-channel transistors M1, M2, and M3. Transistors M1 and M3 are coupled between the inverted and non-inverted portions of the differential bit line pair, respectively, and ground. Transistor M2 is coupled across the first portion of the differential bit line pair. The gate electrodes (hereafter called "gates") of transistors M1, M2, and M3 are coupled together to receive the equilibrate signal designated EQN on row line 79. The VSS equilibration circuit 72 forces the D and /D lines equally to ground potential.

Also coupled across the first portion of the differential bit line pair 52, 54 is a differential two transistor ferroelectric memory cell 50 consisting of N-channel transistor M4 and associated ferroelectric cell capacitor C1, and N-channel transistor M5 and associated ferroelectric cell capacitor C2. Series-connected transistor M4 and capacitor C1 are coupled between line D and the plate line 58 designated PL. Series-connected transistor M5 and capacitor C2 are coupled between line /D and the plate line PL. The gates of transistors M4 and M5 are coupled together and to the word line 56 designated WL. Note that only one memory cell 50 is shown in FIG. 7. Any number of memory cells 50 can be used in actual practice, with the additional memory cells being coupled across the differential bit line portion 52, 54, and with additional word and plate lines to accommodate the additional memory cells. Note also that only a single column is shown, whereas in an actual memory circuit, numerous columns would be used wherein the memory cells 50 would be arranged in rows and columns.

An isolation circuit 43 including N-channel transistors M6 and M7 serve to electrically isolate the first portion 52, 54 of the differential bit line pair from the second portion 52', 54' of the differential bit line pair designated L and /L. The current path of transistor M6 is coupled between lines L and D, and the current path of transistor M7 is coupled between lines /L and /D. The gates of transistors M6 and M7 are coupled together to receive an isolation signal designated LD. Coupled across the second portion 52', 54' of the differential bit line pair is a VCC equilibration circuit 74 consisting of P-channel transistors M8, M9, and M10. Transistors M8 and M9 are coupled between the non-inverted and inverted components of the differential bit line pair 52' and 54', respectively, and the VCC power supply. Transistor M10 is coupled across the second portion of the differential bit line pair. The gates of transistors M8, M9, and M10 are coupled together to receive the equilibrate signal designated EQP on row line 82. The equilibration circuit 82 forces the L and /L lines equally to the the VCC power supply potential.

Also coupled to the second portion 52', 54' of the differential bit line pair are the two bit line load capacitances, CL1 and CL2. Note that these capacitors are also ideally ferroelectric capacitors, so that the charge sharing characteristics match with changes in environmental factors and changes in semiconductor and ferroelectric process specifications. Capacitors CL1 and CL2 can be conventional integrated circuit capacitors, however, if desired. Capacitor CL1 is coupled between line L and ground, and capacitor CL2 is coupled between line /L and ground. Finally, an optional second equilibration circuit 78 consisting of N-channel transistors M11, M12, and M13 is coupled across the second portion 52', 54' of the differential bit line pair. The operation of the optional equilibration circuit 78 is identical to the the equilibration circuit 72 consisting of transistors M1, M2, and M3. The gates of transistors M11, M12, and M13 are coupled together to receive the same EQN equilibrate signal. Lines L and /L are equally forced to ground when the EQN signal is activated.

The operation of memory circuit 70 shown in FIG. 7 is illustrated in the corresponding timing diagram of FIG. 8. The "Return to Zero" sensing and reading method referenced in the Background of the Invention is used as an example only, but it is important to note that any other ferroelectric sensing method may be used. The sensing method begins at an initial time $t_0$ with the EQN signal in a logic one state, thus forcing lines D and D/, as well as lines L and /L, to ground. All other signals are initially at the logic zero level (typically set to the VSS or ground level) except for the isolation signal LD, and the VCC equilibrate signal EQP, both of which are at the logic high level, typically VCC or five volts. With LD high, transistors M6 and M7 are conductive, so bit line components L and D, and /L and /D are coupled together at time $t_0$.

The EQN signal is then switched to a logic zero state at time $t_1$, and the word line signal WL is switched to a logic one state at time $t_2$. Between times $t_3$ and $t_4$ the plate line PL is pulsed as shown by the PL waveform in FIG. 8 from time $t_3$ to time $t_4$. The PL pulse waveform is provided by on-chip decode circuitry (not shown in FIG. 7) and its voltage levels are typically full logic levels. The PL pulse waveform poles the ferroelectric cell capacitors C1 and C2, transferring charge to bit line components D, /D, L, and /L. Note that the first and second portions of the differential bit line pair remain shorted together through transistors M6 and M7.

At time $t_5$ the isolation transistors M6 and M7 are turned off by switching the LD input to a logic zero state. Subsequent to time $t_5$, the first and second portions of the differential bit line pair are electrically isolated, which also isolates the bit line load capacitors CL1 and CL2 from sense amplifier 48, yet preserves the voltage signal on lines D and /D. At time 16 sense amplifier 48 is enabled. Between times $t_7$ and $t_9$ the plate line is again pulsed to reprogram (restore) the original logic states in the memory cells. The rising edge of the second plate line pulse can be slightly delayed if desired. The voltage difference on the first portion of the differential bit line pair is amplified by sense amplifier 48 to full logic levels some time after time $t_7$. Also at time $t_7$, the EQP line 82 is switched to a logic zero state, which brings lines L and /L to a logic one state at time $t_8$, which also polarizes ferroelectric load capacitors CL1 and CL2 to their initial state.

At time $t_{10}$ full logic levels have been reached on lines D and /D lines and the sense amplifier 48 is disabled. Between times $t_{10}$ and $t_{11}$, the VCC equilibrate circuit 74 is turned off, and time $t_{11}$ the word line select signal WL is switched to a logic zero state. At time $t_{12}$, the first and second portions of the bit line are re-coupled by switching signal LD to a logic one state, and the EQN signal is also switched to a logic one state. At time $t_{12}$, the voltage levels on both portions of the bit line are forced to zero, and are fully restored to their original logic zero state at time $t_{13}$. All signals and logic states are now restored to their previous initial states, and the memory cells are ready to be read again.

Thus, it will be appreciated that a capacitance, specifically an integrated circuit ferroelectric capacitance, has been selectively coupled, decoupled, and recoupled to a corresponding bit line via the use of an isolation circuit, transistors M6 and M7. Transistors M6 and M7 are controlled by the LD isolation signal, which is generated by on-chip timing circuitry not shown in FIG. 7.

Figure 9:
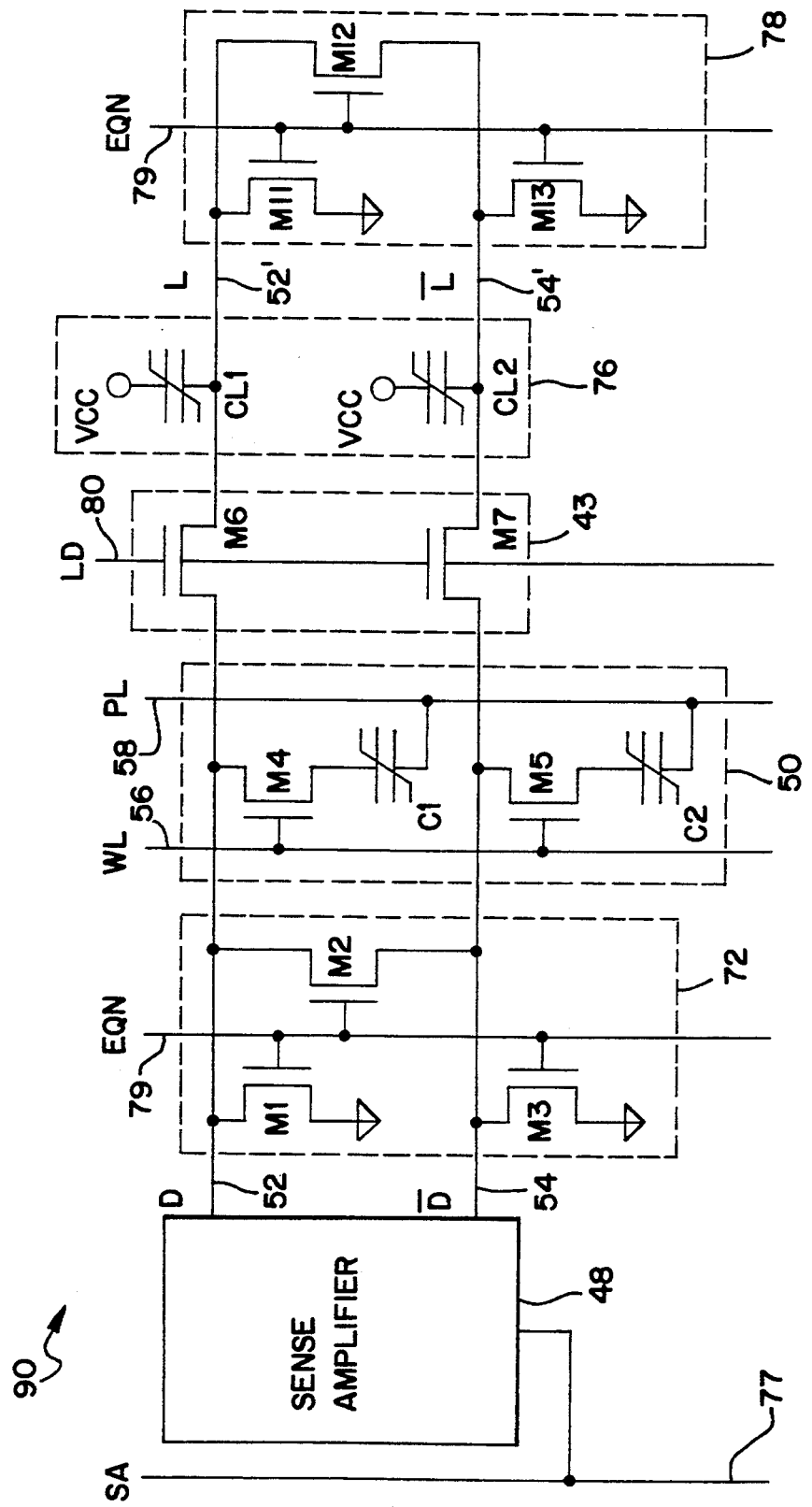
FIG. 9 is a circuit diagram of a second embodiment of the present invention.

Referring now to FIG. 9, a circuit 90, which is a second embodiment of a ferroelectric memory according to the present invention, has the bit capacitance isolation circuit 43, but omits the VCC equilibrate circuit 74 consisting of transistors M8, M9, and M10. Consequently, there is no EQP signal input or row line 82 in memory circuit 60. In addition, the ferroelectric load capacitors CL1 and CL2 are coupled to the VCC power supply voltage source, and not to ground (VSS) as in FIG. 7.

While the second embodiment 90 contains three fewer transistors and one less input signal, the operation is substantially equivalent. Referring now to the corresponding timing diagram of FIG. 10, the signal transitions occur at the same relative times as shown in FIG. 8. The major difference is that voltage levels on the second portion 52', 54' of the differential bit line pair, lines L and /L, are not switched between full logic levels. Therefore, the load capacitors CL1 and CL2 are always polarized in the same direction, i.e. the polarization of the ferroelectric layer is never changed. Since the original polarization of the ferroelectric layer in capacitors CL1 and CL2 is never changed it does not have to be restored from a "flipped" polarization as in circuit embodiment 70.

An important aspect of the present invention is that a ferroelectric memory cell is capable of being used in either the ferroelectric memory operation described above, or in the standard dynamic memory operation. In the dynamic memory operation, the ferroelectric capacitors are not poled, and the actual stored charge on the capacitors is sensed by the sense amplifier. No additional structure is needed to operate either memory circuits 70 or 90 in the dynamic memory mode. To place the memory circuits in the dynamic memory mode, the isolation devices are turned off by switching signal LD to a logic zero state. The load capacitors CL1 and CL2 are electrically isolated for the entire duration of the dynamic mode since they are not needed to develop the data signal.

Another important aspect of the present invention is that any memory cell type can be used. A one-transistor memory cell operating in conjunction with a reference cell, a two-transistor memory cell, or any other type of memory cell configuration can be used. The electrical isolation of the bit line capacitance load as taught herein can be extended to virtually any ferroelectric memory cell configuration or memory architecture. It is also important to note that while one column of a memory circuit, and one or four memory cells within the column is shown in FIGS. 5, 6, 7, and 9, the invention is easily expanded to the more typically memory architecture of multiple columns, and multiple rows of memory cells.

An alternative circuit embodiment for circuit 70 shown in FIG. 7 can be used if the bit lines are precharged to VCC instead of ground. In the alternative circuit embodiment, not shown, N-channel transistors M1–M3, M6–M7, and M11–M13 are replaced with P-channel transistors. The polarity of the LD signal to the gates of replaced transistors M6–M7 is inverted. Replaced transistors M1, M3, M11, and M13 are coupled to VCC instead of ground. Additionally, P-channel transistors M8–M10 are replaced with N-channel transistors. Replaced transistors M8 and M9 are coupled to ground instead of VCC. Bit line load capacitors CL1 and CL2 are coupled to VCC instead of ground. Similarly, an alternative circuit embodiment for circuit 90 shown in FIG. 9 can be used if the bit lines are precharged to VCC instead of ground. In the alternative circuit embodiment, also not shown, N-channel transistors M1–M3, M6–M7, and M11–M13 are replaced with P-channel transistors. The polarity of the LD signal to the gates of replaced transistors M6–M7 is inverted. Replaced transistors M1, M3, M11, and M13 are coupled to VCC instead of ground. Bit line load capacitors CL1 and CL2 are coupled to ground instead of VCC.

Figure 11:
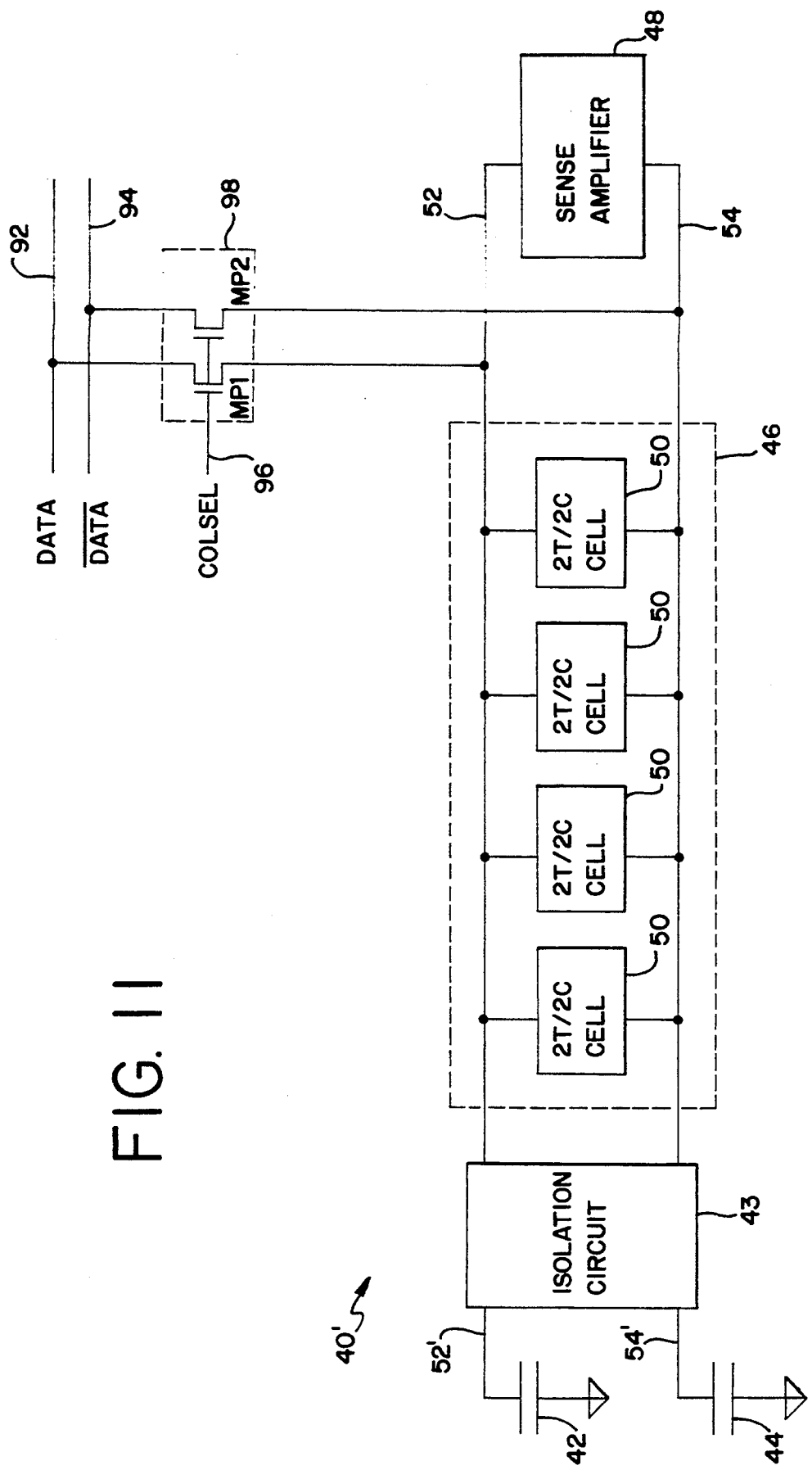
FIG. 11 is a simplified circuit diagram of a column of a 2T-2C ferroelectric memory array modified according to the present invention and showing the associated writing circuitry.

Referring now to FIG. 11, the bit line capacitance isolation method and circuit provide benefits while writing data to the ferroelectric memory cell. A 2T-2C column 40' is shown in FIG. 11, including the corresponding writing circuitry. The circuit topography is identical to that shown in FIG. 6 except for the additional writing circuitry. To write data into any memory cell 50, data is selected from a differential data bus consisting of data line components 92 and 94, designated DATA and /DATA. A pass circuit 98 is under the control of a select signal COLSEL on line 96. The pass circuit 98 includes first and second pass transistors MP1 and MP2, the gates of transistors MP1 and MP2 being coupled together and to line 96. In operation, the pass circuit 98 is energized by a logic high COLSEL signal. Pass transistor MP1 couples the data on line 92 to bit line component 52 and pass transistor MP2 couples the complementary data on line 94 to bit line component 54. During the writing operation, it is desirable that the isolation circuit 43 be activated so that bit line capacitors 42 and 44 are electrically isolated from the differential bit line pair 42, 44. In this way, the time necessary to charge the bit line pair is reduced because the total bit line capacitance is substantially reduced. Thus, the corresponding writing cycle time can be substantially decreased. Electrical contact between the load capacitors CL1 and CL2 and bit line components 52 and 54 is re-established prior to a subsequent read cycle.

Having described and illustrated the principles of the invention in a preferred embodiment thereof, it is appreciated by those having skill in the art that the invention can be modified in arrangement and detail without departing from such principles. For example, other types of semiconductor devices such as bipolar transistors or a mix of MOS and bipolar devices can be used without departing from the principles of the invention. We therefore claim all modifications and variation coming within the spirit and scope of the following claims.

We claim:

1. A ferroelectric memory comprising:
   a bit line;
   a selected ferroelectric memory cell having a data input/output node coupled to the bit line;
   a load capacitor;
   a sense amplifier coupled to the bit line; and
   isolation circuitry for electrically coupling the load capacitor to the ferroelectric memory and the sense amplifier during an initial portion of a read cycle to maximize bit line signal, and for isolating the load capacitor from the sense amplifier and the ferroelectric memory cell during a subsequent portion of the read cycle to allow the sense amplifier to resolve full logic levels on the bit line without the extra capacitance of the load capacitor.

2. A ferroelectric memory as in claim 1 in which the ferroelectric memory cell and sense amplifier are coupled to a first portion of the bit line, the load capacitor is coupled to a second portion of the bit line, and the first and second portions of the bit line are separated by the isolation circuitry.

3. A ferroelectric memory as in claim 1 in which the ferroelectric memory cell comprises:
   a switching transistor having a first current node coupled to the bit line, a second current node, and a gate coupled to a word line; and
   a ferroelectric capacitor having a first node coupled to the second current node of the switching transistor and a second node coupled to a plate line.

4. A ferroelectric memory as in claim 1 in which the load capacitor comprises a ferroelectric capacitor having a first node coupled to the bit line and a second node coupled to a source of supply voltage including ground.

5. A ferroelectric memory as in claim 1 in which the isolation circuitry comprises a switching transistor having a first current node coupled to the sense amplifier and the input/output node of the memory cell, a second current node coupled to the load capacitor, and a gate for receiving a load isolation signal.

6. A ferroelectric memory as in claim I in which the sense amplifier further comprises a sense amplifier enable input for receiving an enable signal while the load capacitor is electrically isolated.

7. A ferroelectric memory as in claim 1 in which the sense amplifier further comprises a reference input coupled to a reference cell.

8. A ferroelectric memory comprising:
   a differential bit line pair including a non-inverted bit line component and an inverted bit line component;

a ferroelectric memory cell having first and second complementary data input/output nodes coupled across the differential bit line pair;

first and second load capacitors;

a differential sense amplifier coupled across the differential bit line pair; and isolation circuitry for simultaneously controlling both of the load capacitors so that they are either both coupled to or both electrically isolated from the sense amplifier and ferroelectric memory cell.

9. A ferroelectric memory as in claim 8 in which the ferroelectric memory cell and sense amplifier are coupled to a first portion of the differential bit line pair, the load capacitor is coupled to a second portion of the differential bit line pair, and the first and second portions of the differential bit line pair are separated by the isolation circuitry.

10. A ferroelectric memory as in claim 8 in which the ferroelectric memory cell comprises:

a first switching transistor having a first current node coupled to one of the bit line components, a second current node, and a gate coupled to a word line;

a first ferroelectric capacitor having a first node coupled to the second current node of the first switching transistor and a second node coupled to a plate line;

a second switching transistor having a first current node coupled to the other of the bit line components, a second current node, and a gate coupled to the word line; and a second ferroelectric capacitor having a first node coupled to the second current node of the second switching transistor and a second node coupled to the plate line.

11. A ferroelectric memory as in claim 8 in which each of the load capacitors comprises a ferroelectric capacitor having a first node coupled to a bit line component and a second node coupled to a source of supply voltage including ground.

12. A ferroelectric memory as in claim 8 in which the isolation circuitry comprises:

a first switching transistor having a first current node coupled to a first input of the sense amplifier and one of the input/output nodes of the memory cell, a second current node coupled to one of the load capacitors, and a gate; and a second switching transistor having a first current node coupled to a second input of the sense amplifier and the other of the input/output nodes of the memory cell, a second current node coupled to the other of the load capacitors, and a gate coupled to the gate of the first switching transistor for receiving a load isolation signal.

13. A ferroelectric memory as in claim 8 in which the sense amplifier further comprises a sense amplifier enable input for receiving an enable signal while the load capacitors are electrically isolated.

14. A ferroelectric memory as in claim 8 further comprising means for equilibrating the differential bit line pair.

15. A ferroelectric memory as in claim 14 in which the equilibration means comprises:

a first N-type switching transistor having a first current node coupled to one of the bit line components, a second current node coupled to a VSS power supply including ground, and a gate;

a second N-type switching transistor having a first current node coupled to the other of the bit line components, a second current node coupled to the VSS power supply, and a gate; and a third N-type switching transistor having first and second current nodes coupled across the differential bit line pair and a gate coupled to the gates of the first and second switching transistors for receiving an equilibrate signal.

16. A ferroelectric memory as in claim 8 further comprising first means for equilibrating a first portion of the differential bit line pair coupled to the differential sense amp and memory cells and second means for equilibrating a second portion of the differential bit line pair coupled to the load capacitors.

17. A ferroelectric memory as in claim 16 in which the first and second equilibration means each comprise:

a first N-type switching transistor having a first current node coupled to one of the bit line components in the respective bit line portion, a second current node coupled to a VSS power supply including ground, and a gate;

a second N-type switching transistor having a first current node coupled to the other of the bit line components in the respective bit line portion, a second current node coupled to the VSS power supply, and a gate; and a third N-type switching transistor having first and second current nodes coupled across the differential bit line pair in the respective bit line portion and a gate coupled to the gates of the first and second switching transistors for receiving an equilibrate signal.

18. A ferroelectric memory as in claim 8 further comprising means for polarizing the ferroelectric load capacitors.

19. A ferroelectric memory as in claim 18 in which the polarization means comprises:

a first P-type switching transistor having a first current node coupled to one of the bit line components associated with the load capacitors, a second current node coupled to a VCC power supply, and a gate;

a second P-type switching transistor having a first current node coupled to the other of the bit line components associated with the load capacitors, a second current node coupled to the VCC power supply, and a gate; and a third P-type switching transistor having first and second current nodes coupled across the differential bit line pair associated with the load capacitors and a gate coupled to the gates of the first and second switching transistors for receiving a polarization signal.

20. A method of reading data from a ferroelectric memory having a ferroelectric memory cell and a load capacitor coupled to a bit line, the method comprising the steps of:

poling the ferroelectric memory cell while the load capacitor is coupled to the bit line so that a maximized bit line signal is developed on the bit line;

subsequently electrically isolating the load capacitor from the ferroelectric memory cell; and sensing and resolving into full logic levels the maximized bit line signal provided by the ferroelectric memory cell after the load capacitor has been electrically isolated.

21. The method of claim 20 in which the sensing step comprises sensing the signal voltage with a sense amplifier that is enabled while the load capacitor is electrically isolated from the ferroelectric memory cell.

22. The method of claim 20 in which the step of electrically isolating the load capacitor comprises disabling a transistor interposed between the memory cell and the load capacitor.

23. A method of writing data into a ferroelectric memory having a differential bit line pair including a non-inverted bit line component and an inverted bit line component, a ferroelectric memory cell having first and second complementary data input/output nodes coupled across the differential bit line pair, first and second load capacitors respectively coupled to each of the bit line components, and a differential sense amplifier coupled across the differential bit line pair, the method comprising the step of:

simultaneously controlling both of the load capacitors so that they are either both coupled to or electrically isolated from the sense amplifier and ferroelectric memory cell; and writing data into the ferroelectric memory cell after both of the load capacitors have been electrically isolated.

24. The method of claim 23 further comprising the step establishing electrical contact between the first and second load capacitors and the ferroelectric memory cell prior to a subsequent read cycle.

25. A method of operating a ferroelectric memory having a ferroelectric memory cell and a load capacitor coupled to a first bit line:, a reference cell not associated with the load capacitor coupled to a second bit line, and a sense amplifier having first and second inputs coupled to the first and second bit lines, the method comprising the step of:

continuously electrically isolating the load capacitor from the ferroelectric memory cell during a DRAM mode of operation.

26. A method of operating a ferroelectric memory having a differential bit line pair including a non-inverted bit line component and an inverted bit line component, a ferroelectric memory cell having first and second complementary data input/output nodes coupled across the differential bit line pair, first and second load capacitors respectively coupled to each of the bit line components, and a differential sense amplifier coupled across the differential bit line pair, the method comprising the step of:

continuously electrically isolating both of the load capacitors from the sense amplifier and ferroelectric memory cell during a DRAM mode of operation.

27. A method of reading data from a ferroelectric memory having a differential bit line pair including a non-inverted bit line component and an inverted bit line component, a ferroelectric memory cell having first and second complementary data input/output nodes coupled across the differential bit line pair, first and second load capacitors respectively coupled to each of the bit line components, and a differential sense amplifier coupled across the differential bit line pair, the method comprising the step of:

poling the ferroelectric memory cell while the load capacitors are coupled to the differential bit line pair so that a maximized bit line signal is developed on the bit line pair;

subsequently simultaneously electrically isolating both of the load capacitors from the ferroelectric memory cell; and sensing and resolving into full logic levels the maximized bit line signal provided by the ferroelectric memory cell after each of the load capacitors have been electrically isolated.

* * * * *